United States Patent
Trampitsch

(10) Patent No.: US 8,907,703 B1
(45) Date of Patent: Dec. 9, 2014

(54) ISOLATED HIGH VOLTAGE SAMPLING NETWORK

(71) Applicant: Linear Technology Corporation, Milpitas, CA (US)

(72) Inventor: Gerd Trampitsch, Unterfoehring (DE)

(73) Assignee: Linear Technology Corporation, Milpitas, CA (US)

( * ) Notice: Subject to any disclaimer, the term of this patent is extended or adjusted under 35 U.S.C. 154(b) by 81 days.

(21) Appl. No.: 13/841,459

(22) Filed: Mar. 15, 2013

(51) Int. Cl.
*G11C 27/02* (2006.01)
*H03K 5/00* (2006.01)
*H03K 17/00* (2006.01)

(52) U.S. Cl.
USPC ............................................. 327/91; 327/94

(58) Field of Classification Search
USPC ................. 327/91–97; 341/122–125
See application file for complete search history.

(56) References Cited

U.S. PATENT DOCUMENTS

| | | | |
|---|---|---|---|
| 6,509,790 B1 * | 1/2003 | Yang | 327/554 |
| 6,731,155 B2 * | 5/2004 | Hakkarainen et al. | 327/390 |
| 7,088,147 B2 * | 8/2006 | Prasad et al. | 327/91 |
| 7,183,814 B2 * | 2/2007 | Kudo | 327/91 |
| 7,786,767 B2 | 8/2010 | Kushner et al. | |
| 7,843,232 B2 * | 11/2010 | Farhat et al. | 327/91 |

OTHER PUBLICATIONS

3GHz, Low Noise, Rail-to-Rail Input Differential Amplifier/Driver, Linear Technology Corporation, 2007.
Yen et al., A MOS Switched-Capacitor Instrumentation Amplifier, IEEE Journal of Solid-State Circuits, vol. SC-17, No. 6, Dec. 1982.

* cited by examiner

*Primary Examiner* — Quan Tra
(74) *Attorney, Agent, or Firm* — Schiff Hardin LLP

(57) ABSTRACT

Methods and systems for sampling a differential signal. The sampling circuit includes a differential input and a differential output. A logic control block, which is powered by $V_{DD}$ and $V_{SS}$ sources, controls the state of switches used to sample and store differential signals. The logic control block is AC coupled to the switches. The sampling circuit is configured to sample a common mode voltage at the differential input of a level that exceeds that of the $V_{DD}$ and $V_{SS}$ sources.

24 Claims, 7 Drawing Sheets

US 8,907,703 B1

ISOLATED HIGH VOLTAGE SAMPLING NETWORK

TECHNICAL FIELD

This disclosure generally relates to the electrical arts, and more particularly to sampling of electronic signals.

DESCRIPTION OF RELATED ART

In recent years there has been an effort to improve methods of and circuits for acquiring analog signals and converting them to the digital domain. Although real world signals are analog, it is often desirable to convert them to the digital domain using analog-to-digital converters (ADCs). For example, sampling systems are frequently found in popular consumer electronic devices such as MP3 players, DVD players and cellular telephones. Other popular uses of sampling systems include those related to data acquisition, test and measurement, and control system applications. Sampling systems and sample-based technology may be found in the electronic components used to construct such devices, which include analog-to-digital converters, switched capacitor networks, signal acquisition circuitry, comparators, and others.

In some applications, sampling systems employ sample and hold circuits that sample a voltage and maintain it in a storage device, such as a capacitor, so that another circuit can measure or otherwise observe the acquired voltage. While single ended sample-and-hold circuits can be used, more commonly, a pair of single ended sample-and-hold circuits are paired together to form differential configurations.

As a practical matter, fully differential inputs have some common-mode voltage variation as the differential-signal at the input swings through its range. Accordingly, a common-mode component results in the outputs. For example, if $V_{INP}$ and $V_{INM}$ do not have equal amplitude and 180° relative phase, a residual common-mode component appears at the sampler inputs. The sampler converts input voltage to charge stored on the sampling capacitors, such that any input common-mode-voltage variation results in a common-mode charge variation on the two sampling capacitors.

FIG. 1 illustrates a differential sample-and-hold circuit for data acquisition systems, as described by R. C. Yen and P. R. Gray, *A MOS Switched-Capacitor Instrumentation Amplifier*, IEEE Journal of Solid-State Circuits, December 1982. Circuit 100 includes a pair of sampling capacitors C1 and C2; gain setting capacitors C3 and C4; and differential amplifiers A1 and A2. The input signal is sampled on to the sampling capacitors C1 and C2. The signal is then transferred to the gain setting capacitors C3 and C4 through switching operations. The output voltage V0 is a replica of the input differential signal multiplied by a voltage gain (e.g., based on capacitor C1/C3 ratios).

Circuit 100 is operative in a sample mode and a hold mode. In the sample mode, the switches corresponding to φ1 are ON while switches corresponding to φ2 are OFF, allowing the differential and common mode input voltages to appear across both sampling capacitors C1 and C2. In the subsequent hold mode, the switches corresponding to φ1 are OFF while switches corresponding to φ2 are ON, thereby forcing the voltage difference between the two inputs $V_{IN}^+$ and $V_{IN}^-$ to zero. Because of the balanced nature of the circuit 100, switch charge injection and clock feed-through are cancelled to the first order. However, the circuit 100 cannot sample substantially outside of it's supply voltage rails (e.g., voltage levels of signals φ1 and φ2).

FIG. 2 illustrates a low noise rail to rail input differential amplifier/driver, as described by the LTC6406 Datasheet. The LTC6406 buffers the input signal with a gain smaller than 1, such that the buffered signal levels do not exceed the input voltage range of the ADC (e.g., LTC2207) which is limited by its supply voltage.

A sampling circuit that attempts to accommodate input common-mode range is described in U.S. Pat. No. 7,786,767 to Kushner et al. As shown in FIG. 3 herein, the sampling circuit 300 has a wide common-mode rejection, as the common-mode output charge is not a function of the input common-mode voltage. However, to achieve this additional immunity to the common-mode, circuit 300 adds buffer amplifier 310 and resistive/SC dividers 312 and 314, which are subject to additional power consumption, noise, design overhead, and chip real-estate. Furthermore, the buffer amplifier 310 does not allow sensing of common mode voltages that far exceed the supply voltage rails.

In view of the foregoing, it would be desirable to provide circuits and methods for a fully isolated sampling network that allows sampling of signals that are not only within, but can also exceed the power supply voltage rails. It would also be desirable to reduce the noise, improve the linearity, and improve the sampling speed of the sampling network. It would also be desirable, to reduce power consumption, circuit aging, and drift that is associated with sampling signals that exceed the power supply voltage rails and/or circuit component limits.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The various methods and circuits disclosed herein relate to differential sampling circuits that can accommodate a common mode input signal that is below, at, and above the power supply rails of the sampling circuit. As generally known, a common-mode signal is one-half the sum of the voltages of a differential input when referenced to a local ground. In one aspect, by AC coupling the control of sampling switches, the common mode signal of the sampled signal can far exceed the supply rails of the sampling circuit. Thus, the common mode signal at the differential input of the sampling circuit is not limited by the supply rails of the sampling circuit. The wide common mode input range is achieved without adversely affecting circuit aging and drift. In one aspect, by tracking and creating a replica of the common mode signal internally, the internal components automatically adjust to the common mode voltage and are capable of sampling the differential voltage at the input without detriment to the reliability of the components. In one example, the methods and circuits can be used as part of an analog-to-digital (ADC) converter.

Figure 1:
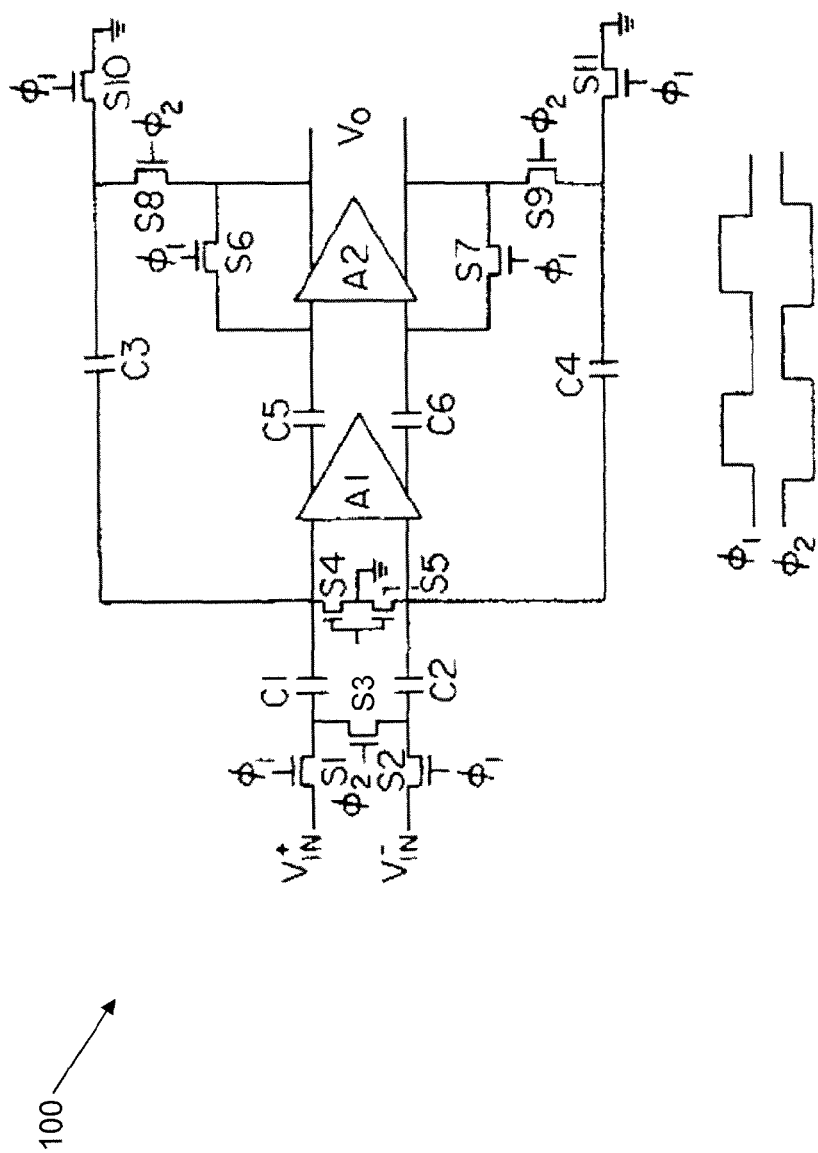
FIG. 1 illustrates a conventional sample-and-hold circuit for data acquisition systems.
Figure 2:
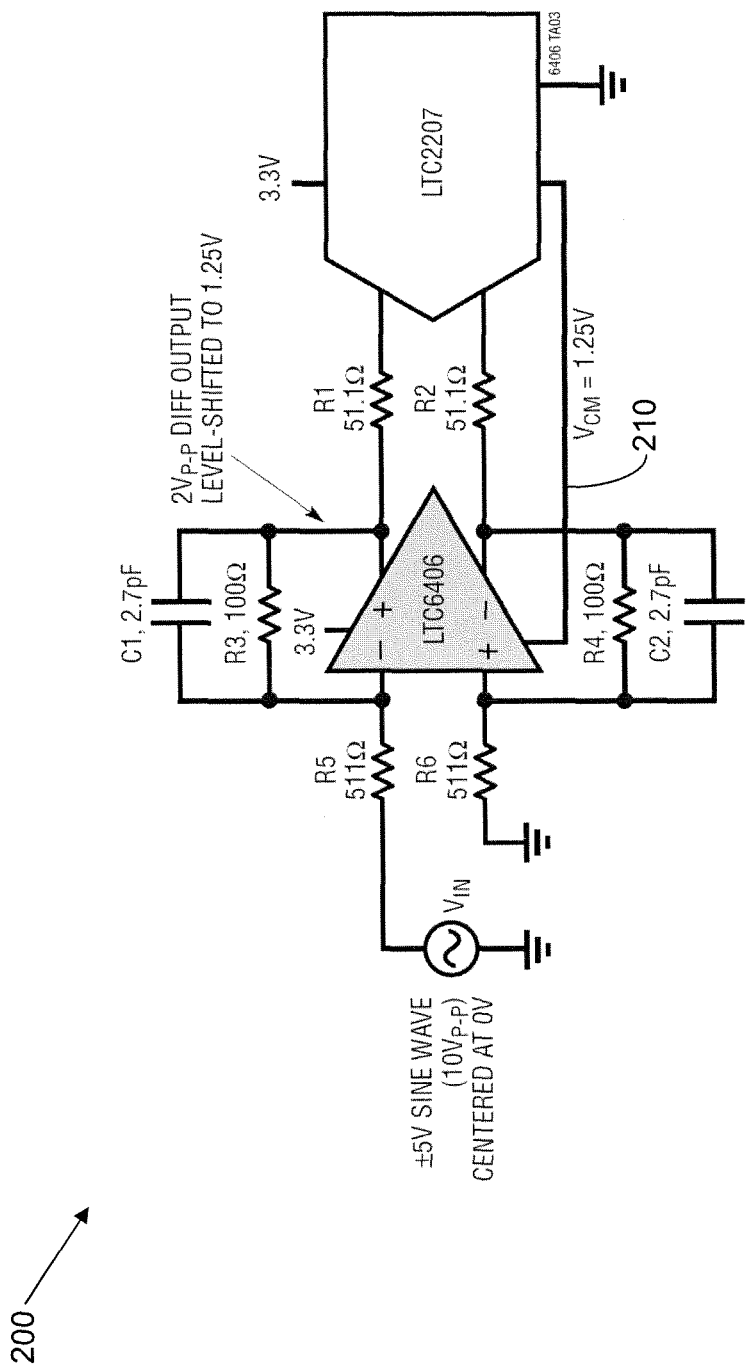
FIG. 2 illustrates a low noise rail to rail input differential amplifier/driver followed by an ADC
Figure 3:
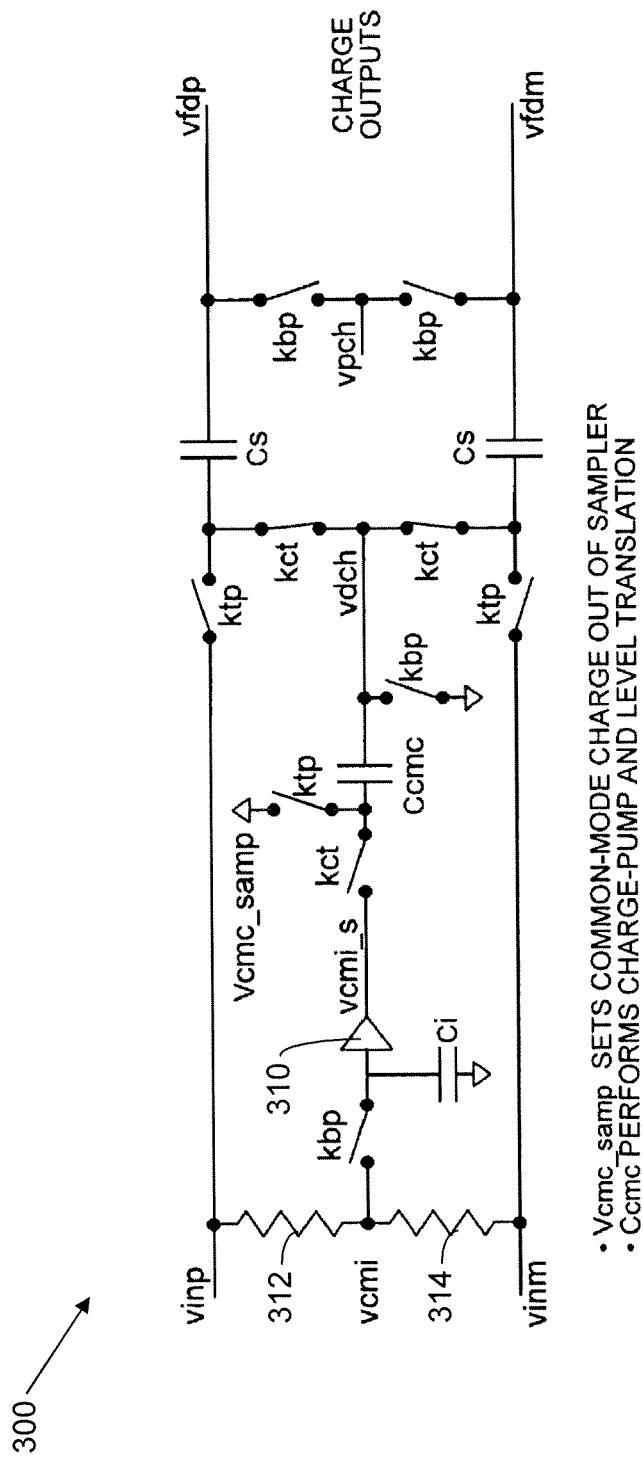
FIG. 3 illustrates a conventional sampling circuit that attempts to accommodate input common-mode range.
Figure 4A:
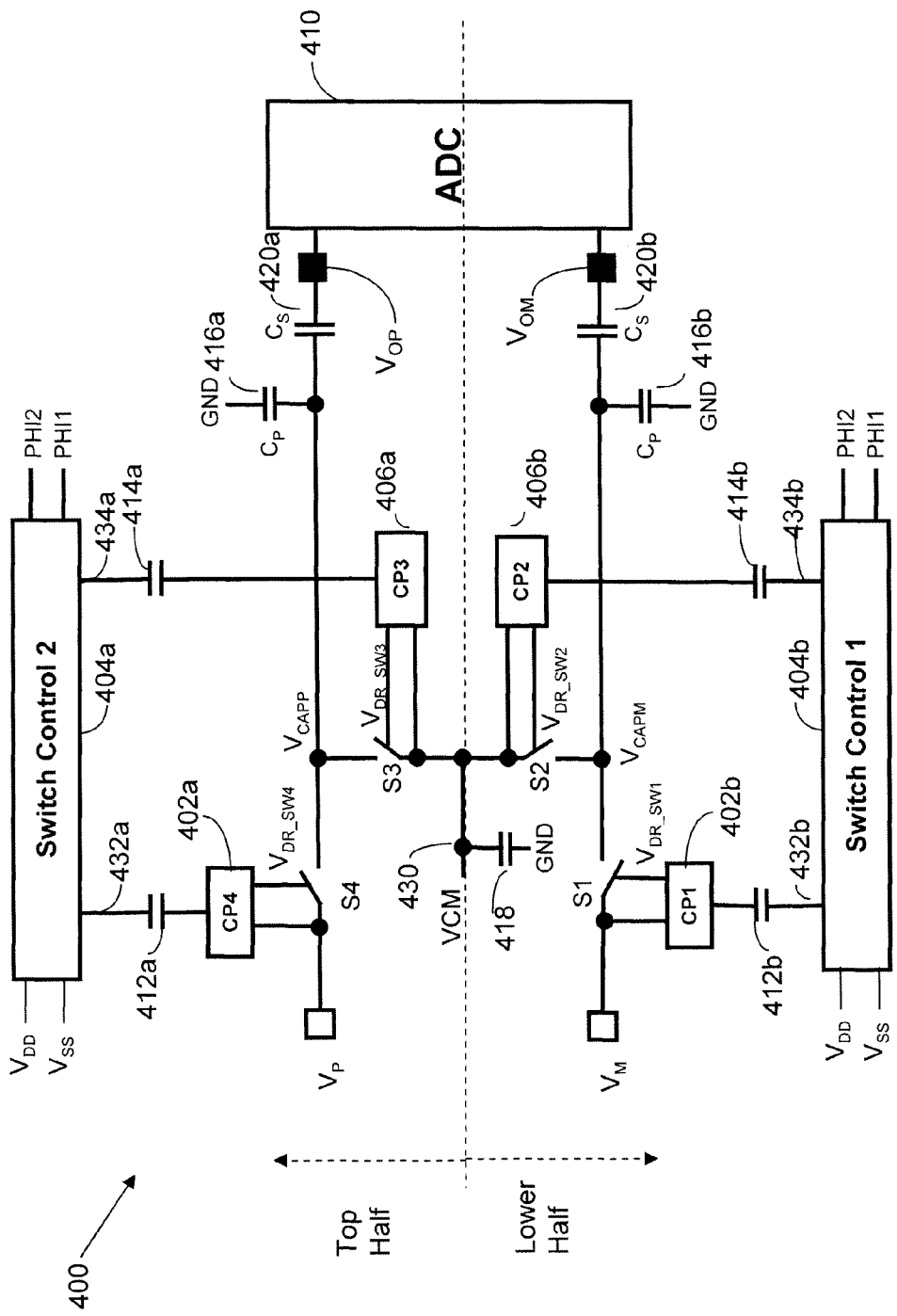
FIG. 4a illustrates a sampling circuit, consistent with an embodiment of the present invention.

Reference now is made in detail to the examples illustrated in the accompanying drawings and discussed below. FIG. 4a illustrates a sampling circuit, consistent with an embodiment of the present invention. Circuit 400 may be used, for example, for sampling values of continuous time-varying amplitude signals at certain time intervals. For example, the sampling may be performed as part of an analog-to digital signal conversion process, wherein amplitude values of an analog input signal are sampled at predetermined time intervals for conversion into binary digital values, to provide a digital output representation of the time-varying input. It will be understood that in a typical application, the rate of sampling is at least twice the highest relevant frequency of the signal applied to the inputs of the sampling circuit 400.

By way of example, circuit 400 is configured in a differential mode. In this regard, circuit 400 includes differential inputs $V_P$ and $V_M$ as well as differential output nodes $V_{CAPP}$ and $V_{CAPM}$. Circuit 400 may provide an AC coupled output that may be connected to an analog-to-digital-converter (ADC) 410. Circuit 400 includes an upper half and a lower half, which are mutually similar. The two halves may be viewed as single-ended sample circuits that have been matted together to form a differential configuration. Accordingly, aspects of circuit 400 will be discussed in the context of the upper half and not repeated for the bottom half for brevity. Some of the differences between the upper half and the lower half will be discussed in a later section.

Circuit 400 includes a plurality of switches (e.g., S1 to S4), storage capacitors (e.g., 416a, 416b, and 418), coupling capacitors (e.g., 412a, 412b, 414a, and 414b), and control logic (e.g., switch control 404a and 404b). Circuit 400 may include additional capacitors, such as 416a and 416b, which may be discrete capacitors or parasitic node capacitance. Circuit 400 may include one or more charge pumps. For example, each switch may have a corresponding charge pump (CP) to provide the proper voltage to turn the switch ON and/or OFF.

Input $V_P$ is coupled to a switch S4, which may be a metal-oxide-semiconductor-field-effect-transistor (MOSFET). When switch S4 is ON, a path is created between the input $V_P$ and a sampling capacitor $C_S$ 420a. The sampling capacitor $C_S$ 420a stores the signal from the positive terminal $V_P$ and provides AC coupling with subsequent circuits, such as ADC 410. The node $V_{CAPP}$ includes capacitance, represented by $C_P$ 416a, which may be inherent (e.g., parasitic capacitance to ground) or be a discrete circuit element (e.g., capacitor). For example, $C_P$ 416a may represent the capacitance of the interconnect between input $V_P$ and the sampling capacitor $C_S$ 420a. When switch S4 is ON capacitor 416a is charged or discharged based on the voltage provided at the positive terminal $V_P$. When switch S4 is OFF, the path between input $V_P$ and the internal storage node $V_{CAPP}$ is severed.

Figure 4B:
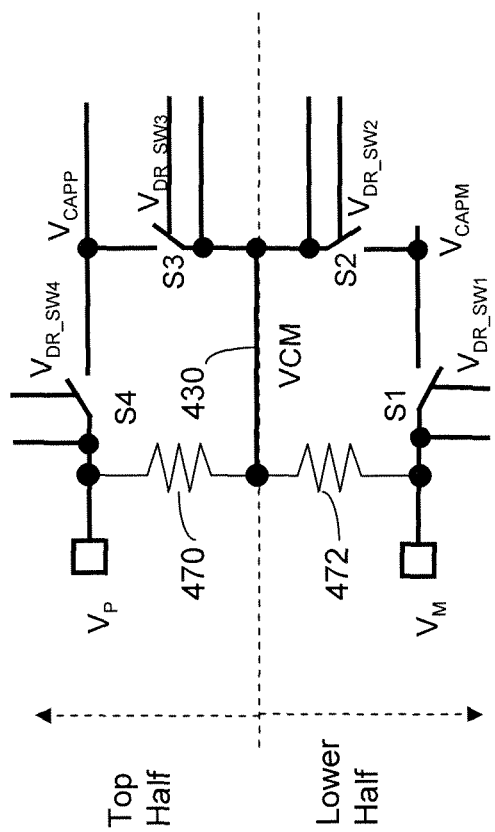
FIG. 4b illustrates a resistive divider network for generating an internal common mode voltage, consistent with an embodiment of the present invention.

Circuit 400 includes switch S3, which has a first node connected to the internal storage node $V_{CAPP}$ and a second node connected to a common mode voltage node 430. The common mode voltage node 430 may be coupled to ground via a series capacitor 418. Capacitor 418 is configured to store the average charge stored in capacitors 416a, 420a, 416b, and 420b as a common mode voltage at node 430 when switches S2 and S3 are ON. In one embodiment, instead of using capacitor 418, a resistive divider network may be used. In this regard, FIG. 4b illustrates a resistive divider comprising resistors 470 and 472 that are coupled between nodes VP and VM. For example, resistors 470 and 472 are of equal resistance and provide the common mode voltage at 430 via the resistive divider.

In circuit 400, switches S4 and S3 are controlled by control logic 404a. Control logic block 404a may be a digital logic block that provides control signals to turn CP4 (402a) and CP3 (406a) ON and OFF based on a predetermined timing sequence. Control logic block 404a has a first input that is coupled to clock φ1 and a second input that is coupled to clock φ2. Control logic block 404a may operate within the range of the power supply levels (e.g., $V_{DD}$ and $V_{SS}$). The signals provided at the outputs of the control logic block 404a are at predetermined voltage levels that are within the range of the power supply voltage levels. Further, the signals at the output of the control logic block 404a are independent of the common mode voltage between the $V_P$ and $V_M$ inputs of circuit 400. The timing sequence with respect to the clock signals φ1 and φ2 is discussed in more detail later. While circuit 400 illustrates two separate switch control circuits 404a and 404b for discussion purposes, both control circuits 404a and 404b may be combined into one.

Outputs 432a and 434a of the control logic block 404a turn switches S4 and S3 ON and OFF, respectively. Switches S4 and S3 are not connected directly to the control logic block 404a. Rather, switch S4 is AC coupled via capacitor 412a and switch S3 is AC coupled via capacitor 414a. The AC coupling provides isolation from the common mode voltage between the inputs $V_P$ and $V_M$. Accordingly, the control logic block 404a can operate at a voltage range that is independent from the common mode voltage of the differential input $V_P$ and $V_M$. Put differently, circuit 400 can sample voltages at its inputs $V_P$ and $V_M$ that are substantially different (e.g., lower or higher) in levels than those of the internal power supply rails (e.g., $V_{DD}$ and $V_{SS}$). By way of example, $V_{DD}$ may be 3.3V and $V_{SS}$ 0V. Unlike conventional sample and hold circuits that can only accommodate a voltage between inputs $V_P$ and $V_M$ that is within the $V_{DD}$ and $V_{SS}$ supply rails (3.3V in this example), in one aspect, circuit 400 can also accommodate common mode voltages that are beyond the $V_{DD}$-$V_{SS}$ supply rails (such as 10V).

Switches S4 and S3 may be coupled to the control logic 404 block 404a via charge pumps CP4 (402a) and CP3 (406a), respectively. The charge pump CP4 (402a) is configured to provide sufficient charge to be able to turn ON switch S4. Charge pump CP4 (402a) has a first terminal that is coupled to the positive terminal $V_P$ and a second terminal that controls the switch S4. Charge pump CP4 (402a) is AC coupled via the capacitor 412a to the control logic block 404a. Accordingly, the AC coupling allows the charge pump 402a to operate in a voltage range that is independent of the supply rails $V_{DD}$ and $V_{SS}$ of circuit 400.

As noted above, charge pumps 402a and 406a provide a voltage that is sufficient to turn ON/OFF their respective switch (e.g., MOSFET). For example, the threshold voltage ($V_{TH}$) of a MOSFET is generally defined as the gate voltage where an inversion layer forms at the interface between the insulating layer and the substrate of the transistor. The formation of the inversion layer allows the flow of electrons from the source to the drain, effectively creating a closed switch that allows the signal to flow (e.g., from node $V_P$ to node $V_{CAPP}$). By using the charge pump, the voltage between the gate to source of the transistor can be made high enough to overcome the transistor $V_{TH}$.

As known in the art, a charge pump is a DC to DC converter that uses capacitors (not all shown in FIG. 4a) as energy storage elements to create a higher (or lower) voltage power source. For example, charge pumps may use switching device(s) (e.g., transistors) to control the connection of voltages to the capacitor. Charge pumps can double voltages, triple voltages, halve voltages, invert voltages, fractionally multiply or scale voltages such as x2/3, x4/3, x3/2, etc., and generate arbitrary voltages, depending on circuit topology chosen for particular implementations.

Charge pump 402a has a first input node that is coupled to the positive terminal $V_P$, which allows the charge pump to use the voltage level at $V_P$ as a reference. As is known in the art, a charge pump provides additional voltage based on a reference voltage level ($V_P$ for charge pump 402a). For example, assuming switch S4 is a P channel MOSFET (PFET), the charge pump uses the voltage level at input $V_P$ as the reference to build up the voltage. By tracking the voltage at its input, the charge pump provides a $V_{GS}$ voltage to the gate of the switch (e.g., PFET S4) that is sufficient to turn the transistor ON and/or OFF. Thus, independently of what the voltage level is at the input $V_P$, the charge pump can provide a sufficient voltage to control the switch S4. The charge pump provides a constant predetermined increase in voltage (Δ) independent of the reference voltage. For example, the charge pump 402a may provide a Δ of 2 volts. In this regard, if $V_P$ is at 1V, the gate voltage is 1V−2V=−1V; if $V_P$ is at 10V, the gate voltage is 10V−2V=8V.

Charge pump CP3 (406a) may have a configuration similar to that of charge pump CP4 (402a). As illustrated in FIG. 4a, charge pump 406a has a first input node that is coupled to node VCM, which provides the common mode voltage between differential inputs $V_P$ and $V_M$. Accordingly, charge pump 406a uses the common mode voltage of the differential inputs $V_P$ and $V_M$ as a reference for providing a proper voltage to turn ON and/or OFF switch S3. Put differently, since the charge pump 406a is isolated from the supply rails $V_{DD}$ and $V_{SS}$ of circuit 400, the charge pump can accommodate different common mode voltages, even those that substantially exceed the internal supply rails (i.e., VDD−VSS in this example). The common mode voltage VCM and the generation thereof is discussed in more detail below.

Figure 5:
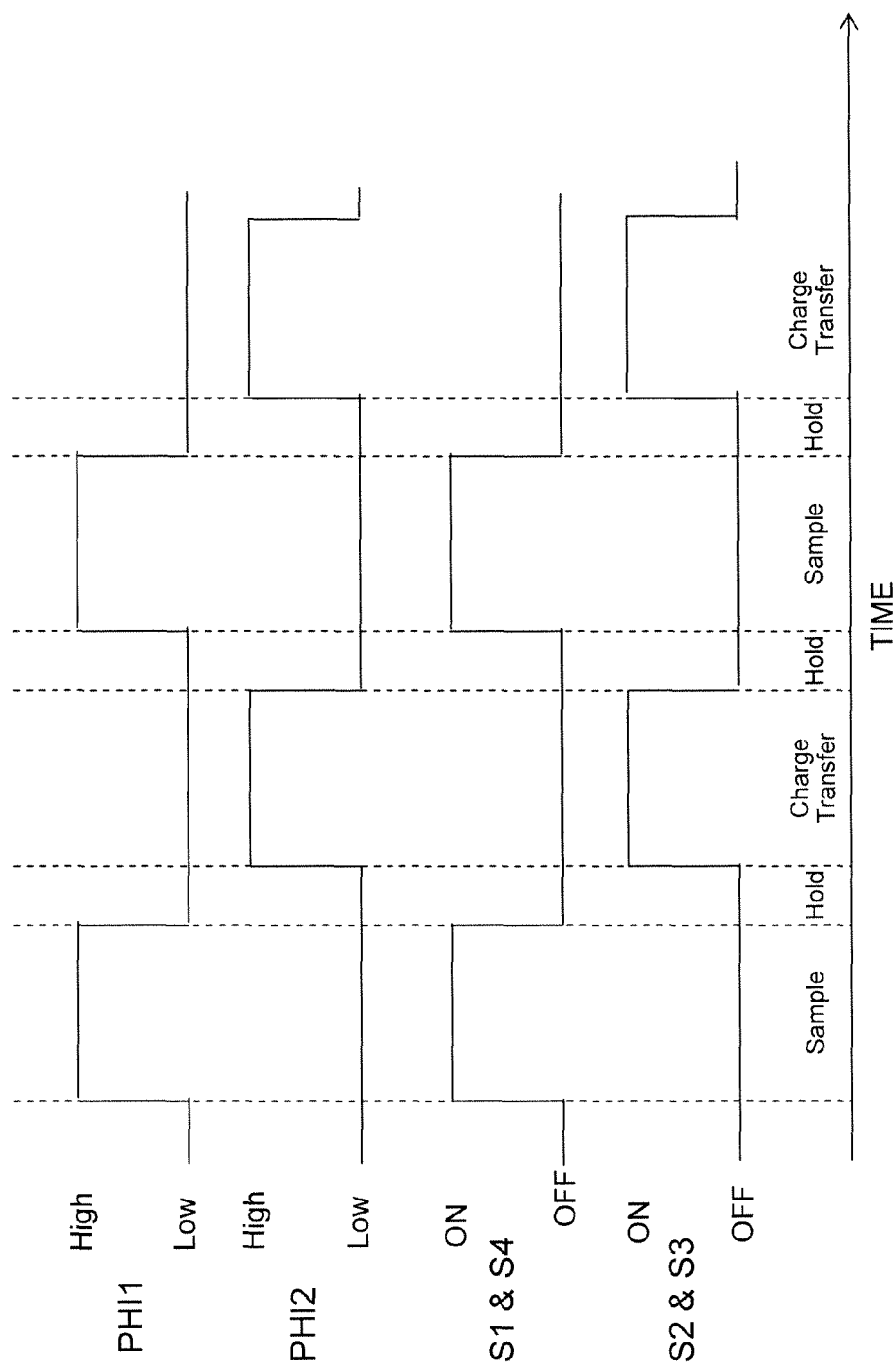
FIG. 5 illustrates an exemplary timing diagram consistent with an embodiment of the present invention.

Circuit 400 may have three main modes of operation, namely (i) a sample, (ii) a hold, and (iii) a charge transfer. These modes may be better understood with reference to FIG. 5, which illustrates an exemplary timing diagram consistent with an embodiment of the present invention. In the following discussion, it will be assumed that circuit 400 has gone through several cycles. The discussion will mainly focus on the operation of the upper half of circuit 400 (and not the lower half) for brevity.

In the sample mode, clock signal Φ1 is high while clock signal Φ2 is low. Logic control block 404a provides a high signal at its output node 432a and a low signal at its output 434a. The charge pump 402a, which is AC coupled to node 432 via capacitor 412a, turns switch S4 ON. Since charge pump 402a does not have a DC path to the logic control block 404a, the charge pump 402a is mainly concerned about the delta voltage that it receives therefrom. The charge pump uses the voltage level at input node $V_P$ as a reference to turn switch S4 ON by (for example) providing a gate voltage to switch S4 that is a predetermined voltage above its threshold ($V_{TH}$) voltage. The charge pump 406a, which is AC coupled to the logic control block 404a via capacitor 414a, turns switch S3 OFF. In this sample mode, sampling capacitor 420a and parasitic capacitor 416a are charged to the voltage at node $V_P$. Similarly, sampling capacitor 420b and parasitic capacitor 416b are charged to the voltage at node $V_M$. Since switches S3 and S2 are OFF, the VCM node 430 is left floating. The voltage that is stored across capacitor 418 represents the common mode voltage between differential inputs $V_P$ and $V_M$ from the previous cycles, which will be discussed later. The common mode voltage VCM at node 430 is not limited to the voltage rails $V_{DD}$ and $V_{SS}$ of the circuit 400. Indeed, due to the AC coupling of the charge pumps CP1 to CP4 and ancillary circuitry (e.g., ADC 410), the common mode voltage may far exceed the voltage rails $V_{DD}$ and $V_{SS}$ of the circuit 400.

In the hold mode, both clock signals Φ1 and Φ2 are low. In this regard, logic control blocks 404a and 404b turn OFF all switches (S1 to S4), respectively. The voltage at node $V_{CAPP}$ is maintained by sampling capacitor $C_S$ 420a and parasitic capacitor $C_P$ 416a. Similarly, voltage at node $V_{CAPM}$ is maintained by sampling capacitor $C_S$ 420b and parasitic capacitor $C_P$ 416b. Accordingly, the differential voltage between nodes $V_{CAPP}$ and $V_{CAPM}$ is stable (except for some leakage). ADC 410 is not damaged by the common mode voltage of $V_{CAPP}$ and $V_{CAPM}$ due to the AC coupling via capacitors 420a and 420b.

In the charge transfer mode charge is transferred to the ADC by closing S2 and S3 when S1 and S4 are open. In this mode, clock signal Φ1 is low while clock signal Φ2 is high. In this regard, logic control block 404a turns OFF switch S4 and turns ON switch S3. Similarly, logic control block 404b turns OFF switch S1 and turns ON switch S2. The internal common voltage (VCM) node 430 tracks the common mode voltage at the differential inputs $V_P$ and $V_M$ via charge redistribution of capacitors CP 416a and $C_S$ 420a in the upper half and CP 416b and $C_S$ 420b in the bottom half of circuit 400. For example, since switches S2 and S3 are both closed, there is a direct path between nodes $V_{CAPP}$ and $V_{CAPM}$. Accordingly, node VCM captures the average charge stored in the capacitors coupled to nodes $V_{CAPP}$ and $V_{CAPM}$ as a common mode voltage across capacitor 418 during charge transfer. Thus, a common mode voltage VCM is automatically generated during charge transfer and maintained by capacitor 418.

By way of example, if the voltage at node $V_{CAPP}$ is 10V (i.e., stored in capacitors 416a and 420a) and the voltage at node $V_{CAPM}$ is 6V (i.e., stored in capacitors 416b and 420b) the internal common mode voltage VCM stored at node 430 is be provided by the equation 1 below:

$$VCM = \frac{V_{CAPP} + V_{CAPM}}{2} = \frac{V_P + V_M}{2} \quad [EQ.\ 1]$$

Accordingly, the common mode voltage at node 430 in the present example is (6V+10V)/2=8V, which is substantially similar to the common mode voltage between the differential input $V_P$ and $V_M$. Thus, the common mode node 430 tracks the input common mode voltage between differential inputs $V_P$ and $V_M$ without the need of resistor dividers or buffer amplifiers, thereby simplifying the design, saving chip real estate, and reducing noise, while accommodating an input common mode voltage that may potentially be larger than the input voltage rails of circuit 400.

In another aspect, circuit 400 can accommodate a differential input voltage that is higher than its supply voltage rails $V_{DD}$ and $V_{SS}$. This concept can be better understood by revisiting Equation 1 above. The common mode voltage VCM stored at node 430 is one half the sum of the voltage at input nodes $V_P$ and $V_M$. Accordingly, the switches (S1 to S4) are only exposed to half of the differential input signal. For example, continuing the example above, if $V_P$=10V, $V_M$=6V, and the resulting VCM=8 with a peak-to-peak amplitude of 4V, then during the sampling mode, the difference across switch S4 is only 10V−8V=2V. Thus, transistor S4 is only exposed to a 2V potential difference even though $V_P$ is at 10V. Accordingly, circuit 400 allows to sample differential signals having twice the drain to source voltage ($V_{DSMAX}$) of a given technology (e.g., building a 30V maximum operating power meter with 15V sampling switches), thereby substantially expanding the voltage range of operation for the switches while reducing possibility of degradation thereof.

Figure 6:
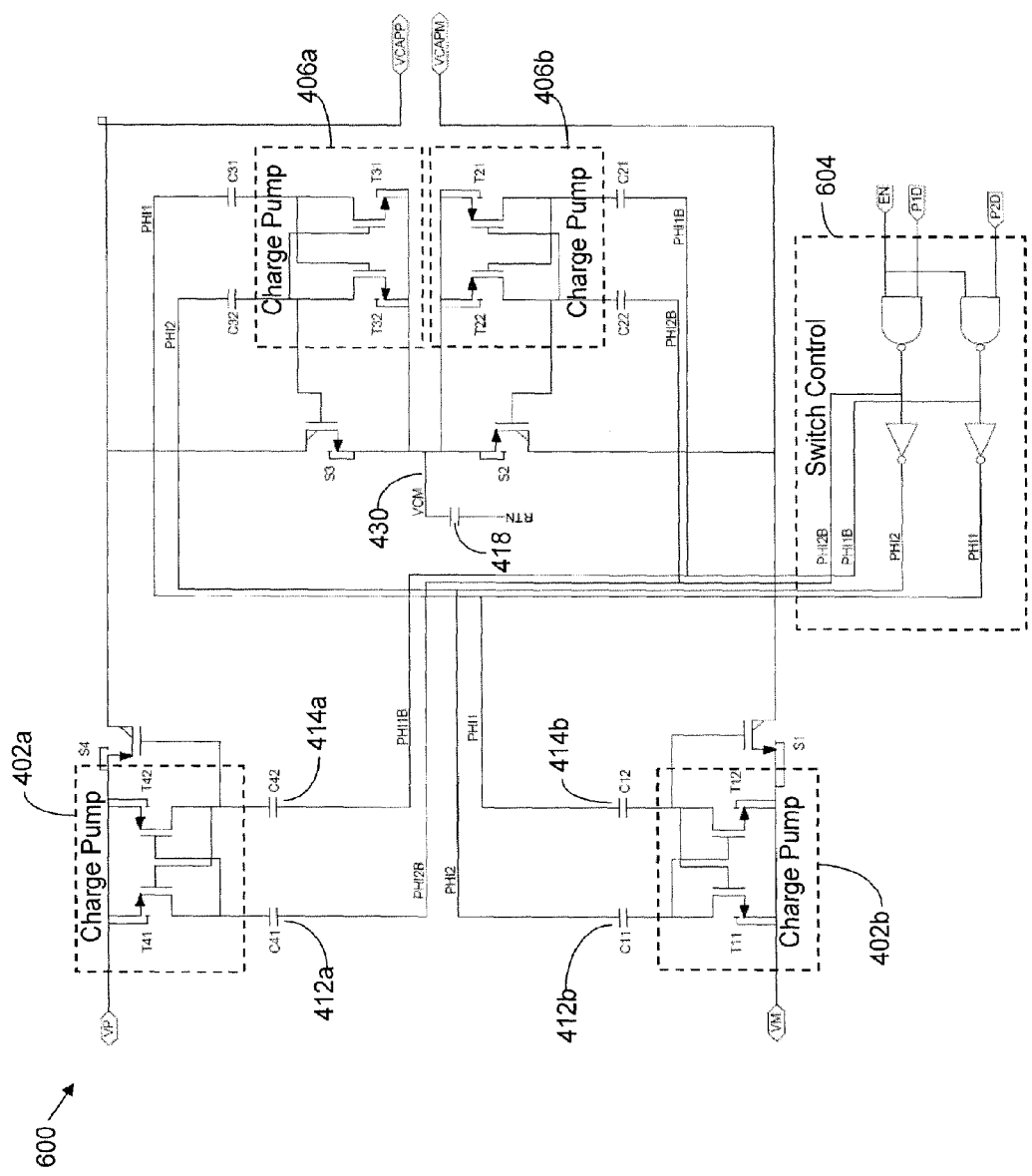
FIG. 6 illustrates a sampling circuit with a more detailed view of an exemplary charge pump, consistent with an embodiment of the present invention.

FIG. 6 illustrates a sample circuit with a more detailed view of the charge pump, in accord with an embodiment of the present invention. In the example of circuit 600, charge pump 402a comprises two P channel MOSFET (PFET) T41 and T42. In charge pump 402a, the source of PFETs T41 and T42 are connected to the positive input node V. The gate of transistors T41 and T42 are cross-coupled to the drain of the opposite transistor. Transistors T41 and T42 interact with capacitors 412a and 414a to provide a voltage at the gate of switch S4 that is large enough to turn the switch ON (e.g., a gate to source voltage larger than the threshold voltage of the transistor). For example, the charge pump 402a uses the voltage at node Vp as the reference voltage for pumping up the voltage and then provides the pumped up voltage to the gate of switch S4. In one embodiment, switch S4 is a PFET. In this regard, to turn ON PFET S4, the gate to source voltage is negative.

In the example of circuit 600, charge pump 406b is configured similarly to charge pump 402a and the latter is therefore not discussed in detail for brevity. Charge pump 406b uses the internal common mode voltage VCM at node 430, which is a replica of the common mode voltage between differential inputs $V_P$ and $V_M$, as the reference voltage for providing a pumped voltage to the gate of switch S2. In one embodiment, switch S2 is a PFET.

In the example of circuit 600, charge pump 402b comprises two N channel MOSFETs (NFET) T11 and T12. In charge pump 402b, the source of NFETs T11 and T12 are connected to the negative input node $V_M$. The gate of transistors T11 and T12 are cross-coupled to the drain of the opposite transistor. Transistors T11 and T12 interact with capacitors 412b and 414b to provide a voltage at the gate of switch S1 that is large enough to turn the switch ON (e.g., a gate to source voltage larger than the threshold voltage of the transistor). For example, the charge pump 402b uses the voltage at node $V_M$ as the reference voltage, pumps up the voltage, and then provides the pumped up voltage to the gate of switch S1.

Switch S1 may be an NFET. In this regard, to turn ON NFET S1, the gate to source voltage is larger than the threshold voltage of transistor S1. For example, when signal (D1 is high, capacitor C12 increases the $V_{GS}$ of S1 to provide a voltage that is above the threshold voltage of transistor S1, thereby turning transistor S1 ON. At the same time, transistor T11 is ON, thereby providing a path between capacitor C11 and input node $V_M$. Φ1 and Φ2 preferably are non overlapping clock signals. Accordingly, either Φ1 or Φ2 is high. To turn OFF NFET S1, the $V_{GS}$ is brought below its threshold voltage (e.g., 0V). For example, NFET S1 may be turned OFF when Φ2 is high, which turns transistor T12 ON via coupling capacitor C11. When transistor T12 turns ON, it pulls the gate of NFET S1 to node $V_M$, thereby discharging $V_{GS}$ to 0V and ultimately turning OFF switch S1.

In the example of circuit 600, charge pump 406a is configured similarly to charge pump 402b and the latter is therefore not discussed in detail for brevity. Charge pump 406a uses the internal common mode voltage VCM at node 430, which is a replica of the common mode voltage between differential inputs $V_P$ and $V_M$, as the reference voltage for providing a pumped voltage to the gate of switch S3. In one embodiment, switch S2 is an NFET.

Circuit 600 includes an exemplary switch control logic block 604 that operates between power rails $V_{DD}$ and $V_{SS}$. When clock signal Φ1 is high while clock signal Φ2 is low, switches S1 and S4 are turned ON while switches S2 and S3 are OFF, consistent with the sample mode discussed earlier. When clock signal Φ1 is low while clock signal Φ2 is high, switches S1 and S4 are OFF while switches S2 and S3 are turned ON, consistent with the charge transfer mode discussed earlier. Accordingly, in the example of circuit 600, switches S1, S2, S3, and S4 are bootstrapped switches.

The components, steps, features, objects, benefits and advantages that have been discussed herein are merely illustrative. None of them, nor the discussions relating to them, are intended to limit the scope of protection. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another mode (e.g., voltage, current, charge, time, etc.,), or converted to another state (e.g., from HIGH to LOW and LOW to HIGH) without materially changing the underlying control method. Further, bipolar transistors (e.g., PNP or NPN) can be used instead of MOS transistors. A PNP may be used instead of NPN, and a PMOS may be used instead of NMOS. Accordingly, it is intended that the invention be limited only in terms of the appended claims. The systems described herein could be converted to equivalent digital logic functions and yet be within the scope of the same method.

The scope of the appended claims is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, system, or apparatus that comprises a list of elements does not include only those elements but may include other elements not expressly listed or inherent to such process, method, system, or apparatus. An element proceeded by "a" or "an" does not, without further constraints, preclude the existence of additional system elements in the process, method, system, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A differential sampling circuit, comprising:
   $V_{DD}$ and $V_{SS}$ voltage sources;
   a differential input having a common mode voltage when a differential input signal is applied thereto;
   a differential output for providing a sample of the differential input signal;
   sampling circuitry coupled to the differential input and including a plurality of switches controlled to sample the differential input signal and store a replica of the common mode voltage at a common mode node, wherein the common mode voltage exceeds the voltages of the $V_{DD}$ and $V_{SS}$ sources; and
   a logic control block powered by $V_{DD}$ and $V_{SS}$ sources and configured to control the switches.

2. The sampling circuit of claim 1, wherein the differential output is AC coupled to the switches.

3. The sampling circuit of claim 1, further comprising a respective series capacitor coupled between the logic control block and each switch, respectively.

4. The sampling circuit of claim 1, further comprising an analog-to-digital converter (ADC) that is AC coupled to the differential output and configured to convert a voltage at the differential output into a digital signal.

5. The sampling circuit of claim 1, further comprising a respective charge pump in series with a capacitor coupled between each switch and the logic control block, wherein each charge pump is configured to provide a gate to source voltage to its coupled switch sufficient to control an ON or OFF state of the switch.

6. The sampling circuit of claim 1, further comprising a resistive divider connected between a positive input node and a negative input node of the differential input and configured to provide the replica of the common mode voltage to the common mode node.

7. A differential sampling circuit, comprising:
   a differential input having a positive input node and a negative input node;
   a differential output having a positive output node and a negative output node;
   a first switch coupled between the negative input node and a negative internal storage node;
   a second switch coupled between an internal common mode node and a negative internal storage node;
   a third switch coupled between the internal common mode node and the positive internal storage node;
   a fourth switch coupled between the positive input node and the positive internal storage node; and
   a logic control block powered by $V_{DD}$ and $V_{SS}$ voltage sources and configured to control each switch so as to cause the differential sampling circuit to sample a common mode voltage at the differential input that exceeds the voltages of the $V_{DD}$ and $V_{SS}$ sources;
   wherein the logic control block is AC coupled to:
      the first switch via a first series capacitor;
      the second switch via a second series capacitor;
      the third switch via a third series capacitor; and
      the fourth switch via a fourth series capacitor.

8. The sampling circuit of claim 7, wherein the logic control block includes:
   an input to receive a first clock; and
   an input to receive a second clock.

9. The sampling circuit of claim 8, wherein:
   the first and fourth switches are configured to be ON when the first clock is high and the second clock is low; and
   the second and third switches are configured to be OFF when the first clock is high and the second clock is low.

10. The sampling circuit of claim 7, further comprising:
    a first sampling capacitor connected in series between the positive internal storage node and the positive output node; and
    a second sampling capacitor connected in series between the negative internal storage node and the negative output node.

11. The sampling circuit of claim 10, further comprising an analog to digital circuit having:
    a first input coupled to the positive output node; and
    a second input coupled to the negative output node.

12. The sampling circuit of claim 7, further comprising:
    a first charge pump coupled between the first switch and the first series capacitor;
    a second charge pump coupled between the second switch and the second series capacitor;
    a third charge pump coupled between the third switch and the third series capacitor; and
    a fourth charge pump coupled between the fourth switch and the fourth series capacitor.

13. The sampling circuit of claim 7, further comprising a common mode storage capacitor coupled between the common mode node and ground.

14. The sampling circuit of claim 12, wherein:
the first charge pump is configured to use a voltage of the negative input node of the differential input as a reference voltage to create a voltage sufficient to turn ON or OFF the first switch;
the second charge pump is configured to use a voltage of the internal common mode node as a reference voltage to create a voltage sufficient to turn ON or OFF the second switch;
the third charge pump is configured to use a voltage of the internal common mode node as a reference voltage to create a voltage sufficient to turn ON or OFF the third switch; and
the fourth charge pump is configured to use a voltage of the positive input node of the differential input as a reference voltage to create a voltage sufficient to turn ON or OFF the fourth switch.

15. The sampling circuit of claim 7, wherein each switch is a metal-oxide-semiconductor field-effect transistor (MOSFET).

16. The sampling circuit of claim 15, wherein:
the first charge pump comprises:
a first NFET having a source coupled to the negative node of the differential input; and
a second NFET having a source coupled to the negative node of the differential input;
wherein a gate of the first NFET and a gate of the second NFET are cross coupled;
the second charge pump comprises:
a first PFET having a source coupled to the internal common mode node; and
a second PFET having a source coupled to the internal common mode node; wherein a gate of the first and a gate of the second PFET are cross coupled;
the third charge pump comprises:
a third NFET having a source coupled to the internal common mode node; and
a fourth NFET having a source coupled to the internal common mode node; wherein a gate of the third NFET and a gate of the fourth NFET are cross coupled; and
the fourth charge pump comprises:
a second PFET having a source coupled to the positive node of the differential input; and
a third PFET having a source coupled to the positive node of the differential input;
wherein a gate of the second and a gate of the third PFET are cross coupled.

17. The sampling circuit of claim 15, wherein each switch is configured to sample signals up to twice a maximum rated drain to source voltage.

18. In a differential sampling circuit, comprising:
a differential input having a positive input node and a negative input node;
a differential output having a positive output node and a negative output node;
a first switch coupled between the negative input node and a negative internal storage node;
a second switch coupled between an internal common mode node and the negative internal storage node;
a third switch coupled between the internal common mode node and the positive internal storage node;
a fourth switch coupled between the positive input node and the positive internal storage node;
at least one logic control block to control an ON or OFF state of each switch;
a method of sampling a differential signal comprising:
in a sample mode:
turn ON the first and fourth switch;
turn OFF the second and third switch;
store a voltage from the positive input node at the positive internal storage node ($V_{CAPP}$); and
store a voltage from the negative input node at the negative internal storage node ($V_{CAPM}$);
in a charge transfer mode:
turn OFF the first and fourth switch;
turn ON the second and third switch;
store a voltage at the internal common mode (VCM) node based on:

$$VCM = \frac{V_{CAPP} + V_{CAPM}}{2};$$

wherein each switch is controlled by the logic control block via AC coupling.

19. The method of claim 18, further comprising powering the logic control block by power supply levels $V_{DD}$ and a $V_{SS}$, wherein the voltage stored at the internal common mode node is $\geq (V_{DD}-V_{SS})$.

20. The method of claim 18, wherein, in the sample mode, a voltage across each switch is up to twice a maximum rated drain to source voltage of each switch, respectively.

21. The method of claim 18, wherein:
turning ON the first switch comprises using the voltage at the negative input node as a reference to pump up to a voltage level that exceeds a gate to source voltage of the first switch;
turning ON the second switch comprises using the voltage at the internal common mode node as a reference to pump up to a voltage level that exceeds a gate to source voltage of the second switch;
turning ON the third switch comprises using the voltage at the internal common mode node as a reference to pump up to a voltage level that exceeds a gate to source voltage of the third switch; and
turning ON the fourth switch comprises using the voltage at the positive input node as a reference to pump up to a voltage level that exceeds a gate to source voltage of the fourth switch.

22. The method of claim 18, further comprising:
AC coupling the positive internal storage node with the positive output node; and
AC coupling the negative internal storage node with the negative output node.

23. The method of claim 18, wherein the sample mode further comprises floating the internal common mode node.

24. The method of claim 18, further comprising:
powering the logic control block with VDD and VSS voltage sources; and
receiving a common mode voltage at the differential input that exceeds in magnitude at least one of:
(i) the VDD voltage source; and
(ii) the VSS voltage source.

* * * * *